(12) United States Patent
Koste et al.

(10) Patent No.: US 8,101,898 B2
(45) Date of Patent: Jan. 24, 2012

(54) OPTICALLY GATED MEMS SWITCH

(75) Inventors: Glen Peter Koste, Niskayuna, NY (US); Kathleen Ann O'Brien, Niskayuna, NY (US); Kanakasabapathi Subramanian, Clifton Park, NY (US); John Norton Park, Rexford, NY (US)

(73) Assignee: General Electric Company, Niskayuna, NY (US)

( * ) Notice: Subject to any disclaimer, the term of this patent is extended or adjusted under 35 U.S.C. 154(b) by 488 days.

(21) Appl. No.: 12/408,937

(22) Filed: Mar. 23, 2009

(65) Prior Publication Data
US 2010/0237227 A1 Sep. 23, 2010

(51) Int. Cl.
*G01J 1/44* (2006.01)
*H01J 40/14* (2006.01)

(52) U.S. Cl. .............. 250/206; 250/214.1; 136/244
(58) Field of Classification Search ............... 250/208.1, 250/208.2, 214.1, 214 R, 206, 214 DC; 136/243, 136/244, 252; 257/431
See application file for complete search history.

(56) References Cited

U.S. PATENT DOCUMENTS

| 6,724,512 | B2 | 4/2004 | Carlson et al. | |
|---|---|---|---|---|
| 6,798,936 | B2 | 9/2004 | Sato | |
| 7,449,668 | B2 | 11/2008 | Schutten et al. | |
| 2009/0027001 | A1* | 1/2009 | Haines | 320/101 |
| 2009/0194674 | A1* | 8/2009 | Shih | 250/214 R |
| 2010/0282289 | A1* | 11/2010 | Wu et al. | 136/244 |

* cited by examiner

*Primary Examiner* — Francis M Legasse, Jr.
(74) *Attorney, Agent, or Firm* — Penny A. Clarke

(57) ABSTRACT

An optically powered MEMS gate driver includes a photovoltaic converter configured to receive a light signal from a light source and output a DC supply voltage for a MEMS gate driver in response thereto. The MEMS gate driver further includes a DC to DC converter electrically coupled to the photovoltaic converter and configured to output a line level DC voltage in response to the DC supply voltage. An electrical circuit, also included as a portion of the MEMS gate driver is electrically coupled to both the photovoltaic converter and the DC to DC converter is configured to receive the supply voltage and the line level voltage and to output a line level drive signal in response thereto. The optically powered MEMS gate driver is self-contained within a common EMI enclosure thus providing isolation between the gate driver and command signal electronics.

22 Claims, 2 Drawing Sheets

OPTICALLY GATED MEMS SWITCH

BACKGROUND

The invention relates generally to power switching, and more particularly to an electrically isolated microelectromechanical system (MEMS) power switch gate driver using optical power and gate drive signal delivery.

Electrical gate drives have been developed for controlling semiconductor switches used for energizing a load. The gate drive is electrically coupled to an external voltage source via at least two electrical conductors. A drawback with this design is that electromagnetic interference (EMI) can degrade operational performance of the gate drive by inducing undesired voltages and/or currents in the conductor. This condition can create two types of problems: 1) unintentional turn-on or unintentional turn-off of the gate drive, and 2) electromagnetic radiation from high frequency currents flowing down the wires.

A need therefore exists for an improved gate drive mechanism that can be optically powered and controlled and that reduces and/or eliminates the foregoing deficiencies.

BRIEF DESCRIPTION

An electrically isolated MEMS gate driver using optical power and gate drive signal delivery in accordance with an exemplary embodiment comprises:
  a photovoltaic converter configured to receive a light signal from a light source via a fiber optic cable and to output a supply voltage between about 3 volts DC and about 15 volts DC in response to the light signal;
  a DC to DC converter electrically coupled to the photovoltaic converter and configured to output a line level voltage between about 75 volts DC and about 140 volts DC in response to the supply voltage; and
  an electrical circuit electrically coupled to both the photovoltaic converter and the DC to DC converter, the electrical circuit being configured to receive the supply voltage and the line level voltage and to output a MEMS gate drive signal between about 60 volts DC and about 125 volts DC in response thereto.

According to another embodiment, an optically powered MEMS gate driver comprises:
  a photovoltaic converter configured to receive a light signal from a light source and output a DC supply voltage for a MEMS gate driver in response thereto;
  a DC to DC converter electrically coupled to the photovoltaic converter and configured to output a line level DC voltage in response to the DC supply voltage; and
  an electrical circuit electrically coupled to both the photovoltaic converter and the DC to DC converter, the electrical circuit being configured to receive the supply voltage and the line level voltage and to output a line level drive signal in response thereto.

DRAWINGS

Figure 1:
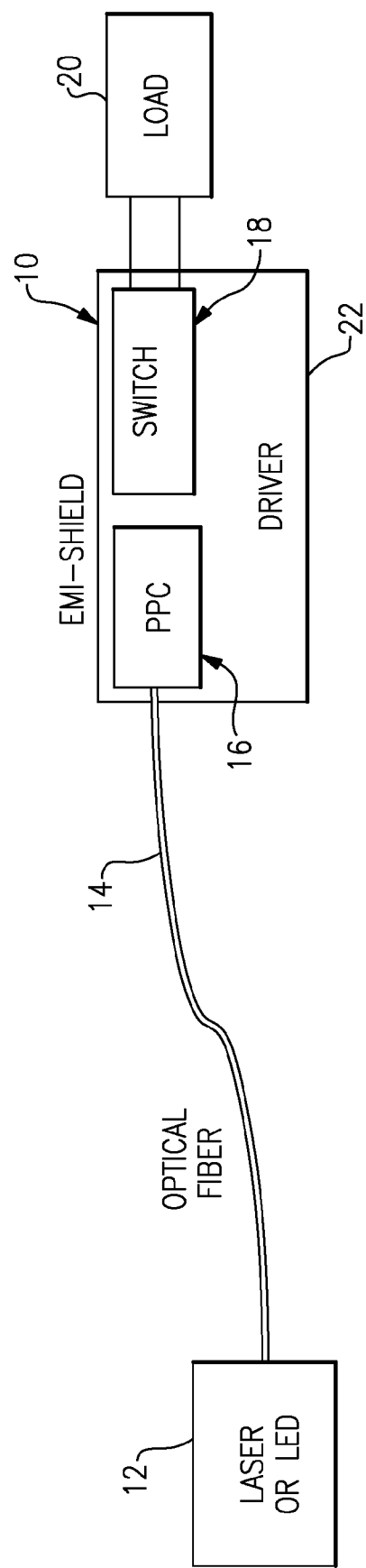
Figure 2:
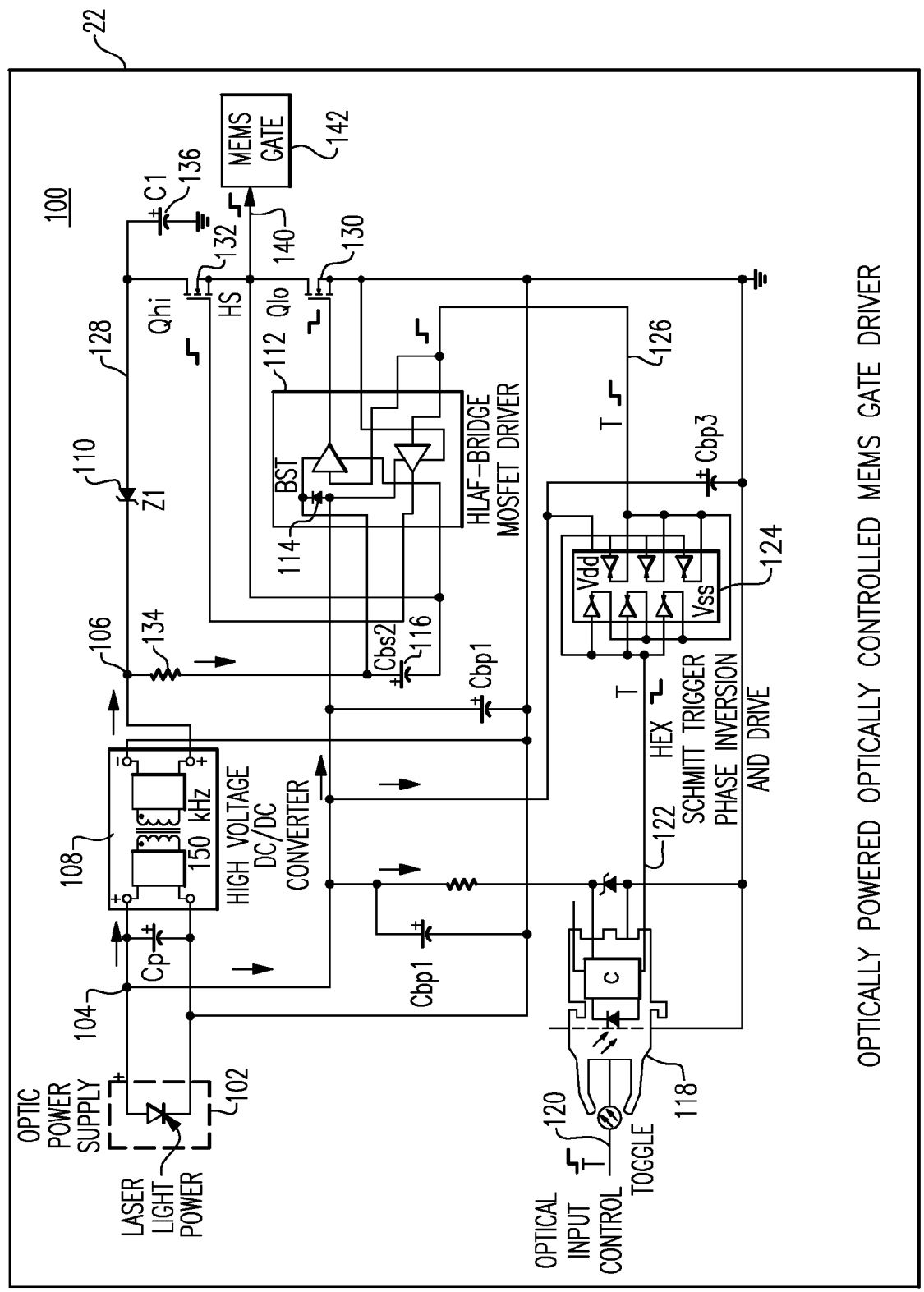

FIG. 1 is a high level system diagram illustrating an optically powered and optically controlled high voltage power switch gate driver in accordance with an exemplary embodiment; and FIG. 2 is a schematic of an optically powered and optically controlled high voltage power switch gate driver in accordance with an exemplary embodiment.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION

Referring to FIG. 1, a high level system diagram illustrating an optically powered and optically controlled high voltage power switch gate driver 10 in accordance with an exemplary embodiment is shown. The gate driver 10 includes a photovoltaic converter 16 and a high voltage switching circuit 18 comprising a DC to DC converter described in further detail below, and further comprising an electrical circuit, also described in more detail below.

A light source 12 comprising, for example, a laser light source is provided to generate a beam for propagation through a fiber optic cable 14 in order to control operation of gate driver 10. The light source 12 is optically coupled to the photovoltaic converter 16 through fiber optic cable 14. It should be noted that in an alternative embodiment, fiber optic cable 14 can contain more than one optical fiber thereby allowing a plurality of light beams to travel through one fiber optic cable.

The photovoltaic converter 16 is provided for generating low DC supply voltage signals controlling an electrical load 20 via high voltage switching circuit 18. The load 20 may comprise, for example, a MEMS switch or other semiconductor high voltage power switch.

The optically powered and optically controlled high voltage power switch gate driver 10 is disposed entirely within a common electromagnetic interference (EMI) shield 22 according to one aspect of the invention. This configuration allows complete electrical isolation between command signal electronics and gate drive signals.

FIG. 2 is a schematic diagram illustrating an optically powered and optically controlled high voltage power switch gate driver 100 in accordance with an exemplary embodiment. High voltage power switch gate driver 100 includes an optic power supply 102 that may comprise, for example, one or more photovoltaic converters or laser driven diodes. The optic power supply 102 is configured to generate a low voltage DC signal 104 in response to a beam of light generated via the light source 12 depicted in FIG. 1. According to one embodiment, optic power supply 102 generates a DC voltage signal and delivers about 800 milliwatts of power. The DC voltage signal may range between about 9 vdc and about 15 vdc.

The low voltage DC signal 104 is converted into a high voltage DC signal 106 via a high voltage DC/DC converter 108 that may be configured via an internal oscillator to operate at a high frequency such as, for example, 150 kHz. According to one embodiment, DC/DC converter 108 converts a 12 volt DC input signal to a high voltage DC output signal that may lie in a range, for example, between about 115 volts to about 140 volts DC. A Zener diode 110 operates to reduce the high voltage DC to a level suitable for operation of a high voltage half-bridge driver 112 to provide a desired MEMS gate drive signal. According to one embodiment, Zener diode 110 may reduce the high voltage DC signal by about 12-15 volts to provide a suitable working voltage that is used in association with a bootstrap diode 114 internal to the half-bridge driver 112 to charge a bootstrap capacitor 116 that is external to the half-bridge driver 112. Bootstrap capacitor 116 is configured to provide a power supply for a high side portion of the high voltage half-bridge driver 112 that operates with reference to the reduced high voltage DC signal 128 to provide a floating driver for an output power FET 132.

A low side portion of the high voltage half-bridge driver 112 is configured to operate in response to an input logic signal 126 and at ground level reference to an output power FET 130. According to one aspect, an optical input receiver 118 responsive to an optical input control signal 120 is configured to generate a sufficiently powered input signal for the high voltage half-bridge driver 112. According to one aspect, an output signal 122 generated via the optical input receiver 118 may be inverted by, for example, a Hex Schmitt Trigger 124 to provide a suitable working input signal 126 such as may be required for some off-the-shelf half-bridge drivers 112.

A resistor 134 couples the high voltage DC signal 106 to one side of the external bootstrap capacitor 116 and operates to keep the external bootstrap capacitor 116 charged and maintain a stable source of power for the high side portion of the high voltage half-bridge driver 112. A capacitor 136 across the reduced high voltage DC signal 128 operates to eliminate or reduce any high current transients that may occur at the output 140 of the high voltage half-bridge driver 112.

According to one embodiment, the output 140 of the high voltage half-bridge driver 112 is employed to drive the gate input of a MEMS device 142 that requires a substantial inrush of current only during switching transients associated with the MEMS device. The inrush of current during such MEMS gate switching transients is then supplied via the capacitor 136 across the reduced high voltage DC signal 128.

In summary explanation, an optically powered and optically controlled high voltage power switch gate driver 100 employs only optical input power and optical input control to provide MEMS gate drive signals 140. According to one aspect, these MEMS gate drive signals 140 may range between about 60 volts and about 125 volts, while simultaneously providing a sufficient amount of current drive during MEMS gate switching transients to provide for MEMS power device switching. According to one embodiment, the gate driver 100 provides the requisite MEMS gate current drive from an optic power supply 102 comprising, for example, a photovoltaic converter such as a laser diode that delivers about 800 mW of continuous power.

According to one aspect, the optically powered and optically controlled high voltage power switch gate driver 100 may operate to provide continuous output power adequate for driving a power semiconductor switching device. According to another aspect, power to a MEMS gate is only necessary during switching transients, and so the power driving the light source 12 depicted in FIG. 1 may be reduced or even turned off when not necessary for activating the power semiconductor switching device or MEMS gate 142.

The optically powered and optically controlled high voltage power switch gate driver 100 therefore obtains all of its power, i.e. 800 mW, from a PPC such as an infrared laser driven diode 102. A half-bridge driver 112 operating at a high frequency above 100 kHz employs an external bootstrap capacitor 116 to boost, via an internal bootstrap diode 114, the supply voltage Vdd for the high-side output FET 132 gate drive. The use of an AC drive is eliminated by pulling the plus side of the bootstrap capacitor 116 to a desired high voltage level generated via the high voltage DC/DC converter 108 and dropping the high-side FET 132 drain supply to a lower high voltage level via a Zener diode 110. The foregoing architecture is useful to provide the desired MEMS gate duty cycle up to and including a continuous MEMS gate high signal.

Although the high voltage DC/DC converter 108 and the half-bridge driver 112 are each depicted as unitary modules, each of these devices may be just as easily implemented using discrete components. Further, although the optically powered and optically controlled high voltage power switch gate driver 100 employs a Schmitt Trigger unit 124 to invert the control signal 122 generated via the optical input receiver 118, such an inverter may not be required for every implementation of the gate driver 100.

The optically powered and optically controlled high voltage power switch gate driver 100 advantageously can be electrically isolated from command signal electronics and may be fully enclosed within an EMI shield making it tolerant of high EMI environments. Further, the gate drive signal can advantageously be at or near line potential. The physical structure resulting from the gate driver 100 architecture will have low size and weight since no electrical filters or transformers generally associated with known mechanical contactors or solid state semiconductor switches are required to achieve the high voltage MEMS gate drive.

While embodiments of the invention are described with reference to the exemplary embodiments, it will be understood by those skilled in the art that various changes may be made and equivalents may be substituted for elements thereof without departing from the scope of the invention. In addition, many modifications may be made to the teachings of the invention to adapt to a particular situation without departing from the scope thereof. Therefore, it is intended that the invention not be limited to the embodiment disclosed for carrying out this invention, but that the invention includes all embodiments falling within the scope of the intended claims.

Furthermore, the use of the terms a, an, etc. do not denote a limitation of quantity, but rather denote the presence of at least one of the referenced items.

The invention claimed is:

1. An optically powered MEMS gate driver, comprising:
   a photovoltaic converter configured to receive a light signal from a light source via a fiber optic cable and to output a supply voltage between about 3 volts DC and about 15 volts DC in response to the light signal;
   a DC to DC converter electrically coupled to the photovoltaic converter and configured to output a line level voltage between about 75 volts DC and about 140 volts DC in response to the supply voltage; and
   an electrical circuit electrically coupled to both the photovoltaic converter and the DC to DC converter, the electrical circuit being configured to receive the supply voltage and the line level voltage and to output a MEMS gate drive signal between about 60 volts DC and about 125 volts DC in response thereto.

2. The optically powered MEMS gate driver of claim 1, wherein the light source comprises at least one laser diode.

3. The optically powered MEMS gate driver of claim 1, wherein the electrical circuit comprises a half-bridge driver configured via a high side driver to generate a floating high level driver signal referenced to the line level voltage in response to an optical input control signal being received by the half-bridge driver, and further configured via a low side driver to generate a low level driver signal referenced to ground in response to the optical input control signal being received by the half-bridge driver.

4. The optically powered MEMS gate driver of claim 3, wherein the half-bridge driver comprises an internal bootstrap diode configured together with a storage capacitor external to the half-bridge driver, to provide power to the high side driver portion of the half-bridge driver.

5. The optically powered MEMS gate driver of claim 3, wherein the electrical circuit further comprises a first switching transistor having a gate input driven via the floating high level driver signal and a second switching transistor having a gate input driven via the low level driver signal, such that together the first switching transistor and the second switching transistor are switched in response to the optical input control signal received by the half-bridge to generate the MEMS gate drive signal.

6. The optically powered MEMS gate driver of claim 3, further comprising an optical receiver configured to generate the optical input control signal received by the half-bridge in response to an optical input control signal received via the optical receiver.

7. The optically powered MEMS gate driver of claim 1, further comprising a storage capacitor charged via the electrical circuit and configured to provide current to a MEMS gate driven via the MEMS gate drive signal during switching transition periods of the MEMS gate.

8. The optically powered MEMS gate driver of claim 1, wherein the photovoltaic converter, DC to DC converter, and electrical circuit are disposed within a common EMI shielded enclosure.

9. The optically powered MEMS gate driver of claim 1, wherein light source comprises a laser.

10. An optically powered MEMS gate driver, comprising:
a photovoltaic converter configured to receive a light signal from a light source and output a DC supply voltage for a MEMS gate driver in response thereto;
a DC to DC converter electrically coupled to the photovoltaic converter and configured to output a line level DC voltage in response to the DC supply voltage; and
an electrical circuit electrically coupled to both the photovoltaic converter and the DC to DC converter, the electrical circuit being configured to receive the supply voltage and the line level voltage and to output a MEMS gate drive signal in response thereto.

11. The optically powered MEMS gate driver of claim 10, wherein the photovoltaic converter, DC to DC converter, and electrical circuit are disposed within a common EMI shielded enclosure.

12. The optically powered MEMS gate driver of claim 10, wherein the DC supply voltage is between about 3 volts and 15 volts.

13. The optically powered MEMS gate driver of claim 10, wherein the line level DC voltage is between about 75 volts and about 140 volts.

14. The optically powered MEMS gate driver of claim 10, wherein the MEMS gate drive signal is between about 60 volts DC and about 125 volts DC.

15. The optically powered MEMS gate driver of claim 10, wherein the DC to DC converter comprises a high frequency oscillator operating at greater than 100 kHz.

16. The optically powered MEMS gate driver of claim 10, wherein the light source comprises a laser, and the photovoltaic converter comprises at least one photo diode.

17. The optically powered MEMS gate driver of claim 10, wherein the electrical circuit comprises a half-bridge driver configured via a high side driver to generate a floating high level driver signal referenced to the line level voltage in response to an optical input control signal being received by the half-bridge driver, and further configured via a low side driver to generate a low level driver signal referenced to ground in response to the optical input control signal being received by the half-bridge driver.

18. The optically powered MEMS gate driver of claim 17, wherein the half-bridge driver comprises an internal bootstrap diode configured together with a storage capacitor external to the half-bridge driver, to provide power to the high side driver portion of the half-bridge driver.

19. The optically powered MEMS gate driver of claim 17, wherein the electrical circuit further comprises a first FET having a gate input driven via the floating high level driver signal and a second FET having a gate input driven via the low level driver signal, such that together the first FET and the second FET are switched in response to the optical input control signal received by the half-bridge to generate the MEMS gate drive signal.

20. The optically powered MEMS gate driver of claim 17, further comprising an optical receiver configured to generate the optical input control signal received by the half-bridge in response to an optical input control signal received via the optical receiver.

21. The optically powered MEMS gate driver of claim 10, wherein the electrical circuit comprises a storage capacitor configured to supply drive current to a MEMS gate driven via the MEMS gate drive signal during switching transition periods of the MEMS gate such that a corresponding MEMS gate switch changes its operating state.

22. The optically powered MEMS gate driver of claim 21, wherein the light source is powered on only when the storage capacitor is not fully charged.

* * * * *